(12) United States Patent
Imai (10) Patent No.: US 7,847,873 B2
(45) Date of Patent: Dec. 7, 2010

(54) DISPLAY DEVICE AND MANUFACTURING METHOD THEREOF

(75) Inventor: Keitaro Imai, Kanagawa (JP)

(73) Assignee: Semiconductor Energy Laboratory Co., Ltd. (JP)

(*) Notice: Subject to any disclaimer, the term of this patent is extended or adjusted under 35 U.S.C. 154(b) by 1046 days.

(21) Appl. No.: 11/451,071

(22) Filed: Jun. 12, 2006

(65) Prior Publication Data

US 2006/0228838 A1 Oct. 12, 2006

(51) Int. Cl.
G02F 1/136 (2006.01)

(52) U.S. Cl. .................................................. 349/47

(58) Field of Classification Search ............... 349/43, 349/47
See application file for complete search history.

(56) References Cited

U.S. PATENT DOCUMENTS

| | | | |
|---|---|---|---|
| 5,117,299 A | 5/1992 | Kondo et al. | 359/58 |
| 5,132,676 A | 7/1992 | Kimura et al. | 340/784 |
| 5,240,801 A | 8/1993 | Hayashi et al. | 430/57 |
| 5,330,616 A | 7/1994 | Yamazaki | 156/643 |
| 5,480,839 A | 1/1996 | Ezawa et al. | |
| 5,583,369 A | 12/1996 | Yamazaki et al. | 257/635 |
| 5,592,318 A | 1/1997 | Majima et al. | 349/122 |
| 5,652,667 A | 7/1997 | Kurogane | 349/42 |
| 5,706,067 A | 1/1998 | Colgan et al. | 349/114 |
| 5,739,890 A | 4/1998 | Uda et al. | 349/156 |
| 5,754,263 A | 5/1998 | Akiyama et al. | 349/110 |
| 5,757,054 A | 5/1998 | Miyawaki et al. | 257/390 |
| 5,767,827 A | 6/1998 | Kobayashi et al. | 345/87 |
| 5,910,271 A | 6/1999 | Ohe et al. | 252/299.01 |
| 5,933,204 A | 8/1999 | Fukumoto | 349/43 |
| 5,946,561 A | 8/1999 | Yamazaki et al. | 438/166 |
| 5,949,107 A | 9/1999 | Zhang | 257/347 |
| 6,008,876 A | 12/1999 | Moore | 349/139 |
| 6,037,197 A | 3/2000 | Yamazaki et al. | 438/151 |
| 6,049,132 A | 4/2000 | Iwahashi et al. | 257/763 |
| 6,294,815 B1 | 9/2001 | Yamazaki et al. | 257/350 |
| 6,326,249 B1 | 12/2001 | Yamazaki et al. | 438/158 |
| 6,364,450 B1 | 4/2002 | Yamaguchi et al. | |
| RE37,882 E | 10/2002 | Ezawa et al. | |

(Continued)

FOREIGN PATENT DOCUMENTS

EP 1 074 861 A2 2/2001

(Continued)

*Primary Examiner*—James A Dudek
(74) *Attorney, Agent, or Firm*—Husch Blackwell LLP Welsh Katz (57) ABSTRACT

Conventionally, photolithography and anisotropic etching are performed to form a plug between an electrode and a wiring, etc., thereby increasing the number of steps, getting the throughput worse, and producing unnecessary materials. To solve the problems, the present invention provides a method for manufacturing a display device, including the formation steps of a conductive layer or wirings, and a contact plug that can treat a larger substrate. In the case of forming a plug for electrically connecting conductive patterns comprising plural layers, a pillar made of a conductor is formed over a base conductive layer pattern, and then, after an insulating film is formed over the entire surface, the insulating film is etched back to expose the conductor pillar, and a conductive pattern in an upper layer is formed by ink jetting. In this case, when the conductor pillar is processed, a resist to be a mask can be formed in itself by ink jetting.

14 Claims, 7 Drawing Sheets

U.S. PATENT DOCUMENTS

| | | | |
|---|---|---|---|
| 6,468,844 B1 | 10/2002 | Yamazaki et al. | 438/156 |
| 6,498,049 B1 * | 12/2002 | Friend et al. | 438/34 |
| 6,556,264 B1 | 4/2003 | Hirakata et al. | 349/110 |
| 6,657,225 B1 | 12/2003 | Inoue | |
| 6,723,576 B2 | 4/2004 | Nozawa et al. | |
| 6,740,900 B2 * | 5/2004 | Hirai | 257/40 |
| 6,794,229 B2 | 9/2004 | Asami et al. | 438/151 |
| 6,953,951 B2 | 10/2005 | Yamazaki et al. | 257/72 |
| 7,091,073 B2 | 8/2006 | Inoue | |
| 7,352,038 B2 * | 4/2008 | Kelley et al. | 257/410 |
| 2003/0054653 A1 | 3/2003 | Yamazaki et al. | 438/694 |

FOREIGN PATENT DOCUMENTS

| | | |
|---|---|---|
| JP | 2-294069 | 12/1990 |
| JP | 6-216258 | 8/1994 |
| JP | 08-204008 | 8/1996 |
| JP | 10-39130 | 2/1998 |
| JP | 10-186349 | 7/1998 |
| JP | 10-303428 | 11/1998 |
| JP | 11-340417 | 12/1999 |
| JP | 2002-82215 | 3/2002 |
| JP | 2002-359246 | 12/2002 |
| JP | 2003-15548 | 1/2003 |
| JP | 2003-58007 | 2/2003 |

* cited by examiner

SWITCHING TFT    FIG. 2C    CAPACITOR

SWITCHING TFT    FIG. 2D    CAPACITOR

DISPLAY DEVICE AND MANUFACTURING METHOD THEREOF

BACKGROUND OF THE INVENTION

This application is based on Japanese Patent Application serial no. 2003-086392 filed in Japan Patent Office on 26, Mar. 2003, the contents of which are hereby incorporated by reference.

1. Field of the Invention

The present invention relates to a method for manufacturing a display device. Specifically, the present invention relates to a method for manufacturing a display device including a wiring formation step by an ink jetting method and a contact plug formation step to electrically connect the wirings.

2. Description of the Related Art

A thin film transistor (TFT) formed by using a thin film on an insulating surface is widely applied to integrated circuits and the like, in many cases, is used as a switching element. Application of a display panel using TFTs greatly expands, in particular, into a large-scale display device. Thus, high definition, high aperture ratio, high-reliability, and growth in size for a screen are required extremely.

A method for manufacturing wirings in such a device using thin film transistors is as follows: after a contact hole to connect to a particular region of a substrate is formed by a combination of photolithography and anisotropic etching, a film of a conductive layer is formed over the entire surface, and then, photolithography and anisotropic etching are preformed by using a mask. (Reference 1: Japanese Patent Laid-Open No. 2002-359246)

As in the above reference 1, in the case where contact holes connecting with a base conductive layer are opened, a resist is patterned by photolithography once, the contact holes are opened selectively by anisotropic etching, and an unnecessary resist is removed. Thereafter, in the case of forming wirings, a conductive layer is deposited over the entire surface, and a resist is patterned by photolithography again, and then, the wirings are processed by anisotropic etching. Like this, two photolithography steps are required for forming up the wirings from the contact holes, and thus, the number of steps is increased. Further, in the case of such a wiring etching treatment, for example, when an ICP etching apparatus is used, selective ratio of a resist and a conductive layer vary and the length or width of the conductive layer varies in the substrate, according to etching conditions such as bias power density, ICP power density, pressure, total flow of etching gases, an oxygenation factor and a temperature of a lower electrode. When an etching treatment is performed, the throughput gets worse since a step of forming a mask is necessary. The conductive layer is formed over the entire surface, and then, an etching treatment is performed to provide the conductive layer with a desired shape, therefore, an unnecessary material is produced. Such a problem is serious in the case of forming wirings over a large size substrate of which side exceeds 1.0 m.

SUMMARY OF THE INVENTION

The present invention has been made in view of the above described problems. It is an object of the present invention to provide a method for manufacturing a display device comprising multilayer wirings that can cope with a large size substrate, or a conductive layer and a contact plug connecting them electrically. Further, it is another object of the present invention to provide a method for manufacturing a display device, including the formation steps of a conductive layer or wirings, and a contact plug by which the throughput or usability of materials can be enhanced.

The present invention takes measures that are described hereinafter in order to solve the above described conventional problems.

In the case of forming a plug for electrically connecting a conductive pattern comprising a layer or a plurality of layers, with wirings or a conductive pattern formed in an upper layer, a pillar made of a conductor is formed over a base conductive layer pattern once, and then, after a layer or a plurality of layers of an insulating film is formed over the entire surface, the insulating film is etched back to expose the conductor (conductive) pillar, and a conductive pattern is formed by ink jetting (an ink jet method). In this case, when the conductor pillar is processed, it is possible to form a resist to be a mask in itself by ink jetting. For the resist material, a material having selectivity in dry etching processing can be used as well as a conventional organic resin. For example, an inorganic material such as $SiO_2$ or a metal material, in particular, a noble metal such as Au, Ag, Cu, or Pt which is hard to be etched by dry etching, or the like, can be also used for the resist material. When a metal material is used for the resist material in etching, there is an advantage that the metal material is not required to be removed after processing.

In other words, patterning is performed easily by jetting resist from ink heads, and a conductive layer is formed over an insulating surface by jetting composition including a conductive material. By combining the steps, a conductive layer pattern for a contact plug, wirings, and the like to connect with the contact plug etc., is formed without performing photolithography. The conductive layer may include a source wiring, a drain wiring, a pixel electrode, an opposite electrode and the like that have conductivity. The conductive layer can be formed according to the present invention.

According to one aspect of the present invention, a layer or a plurality of layers of a conductive layer is formed over a semiconductor formed over a substrate having an insulating surface, by ink jetting. A pillar that is made of the same type conductor as the above conductor or a different type conductor is formed on a particular region of the conductive layer. The pillar made of the conductor can be formed by a method in which a conductive layer is formed over the entire surface once, and a resist pattern is formed on a desired local portion of the conductive layer, and then, anisotropic etching is performed thereon. Thereafter, after forming one layer or plural layers of an insulator is (are) over the entire surface, the conductor pillar is exposed by etching back the insulating film. Lastly, wirings for electrically connecting to the conductor pillar, a pixel electrode, or conductive patterns of a light emitting layer, an opposite electrode, or the like are formed by ink jetting.

In accordance with one aspect of the invention, the method of manufacturing a display device comprises steps of:

forming a first wiring over a substrate having an insulating surface;

forming a conductive film over the substrate so as to cover the first wiring;

forming a resist pattern on the conductive film by ink jetting;

etching the conductive film by using the resist pattern as a mask to form a conductive pillar on the conductive pattern;

forming an insulating film over the substrate so as to cover the conductive pillar and first wiring;

etching back the insulating film to expose an upper surface of the conductive pillar; and forming a second wiring on the insulating film wherein the second wiring contacts the upper surface of the conductive pillar so that the first wiring is electrically connected to the second wiring through the conductive pillar.

As described above, according to the present invention in which a conductive layer is formed by ink jetting, a pixel electrode, a light emitting layer, an opposite electrode of a light emitting element, for example, can be formed sequentially without being exposed to the air, by exchanging composition to be jetted (discharged) from an ink head, or an ink head that is filled with composition.

The present invention using an ink jetting method has advantageous effects such as superiority in evenness of a film thickness, as compared with a screen printing method by which a thin film (typically, a light emitting layer) is formed by applying liquid solution, and baking by using a print roll or a relief board on which a pattern to be printed is engraved.

According to the present invention having the above described structures, wirings or a conductive layer can be easily formed over a large size substrate of which side exceeds 1.0 m. An unnecessary material is not produced so much, since a required amount of a material may be applied to a desired portion. Therefore, the usability of the material is enhanced and the manufacturing cost can be cut down.

The steps such as light-exposure and developing can be drastically reduced because a mask is not required. For example, a plurality of thin films such as a light emitting layer and electrodes of a light emitting element, for example, can be formed sequentially by exchanging composition to be jetted from an ink head, or an ink head that is filled with composition. Consequently, the throughput and productivity can be improved. Further, a mask for light-exposure is not necessary, and thus, circuit wirings that are inputted into a personal computer can be manufactured immediately.

These and other objects, features and advantages of the present invention become more apparent upon reading of the following detailed description along with the accompanying drawings.

DETAILED DESCRIPTION OF THE INVENTION

Embodiment Mode

Figure 1:
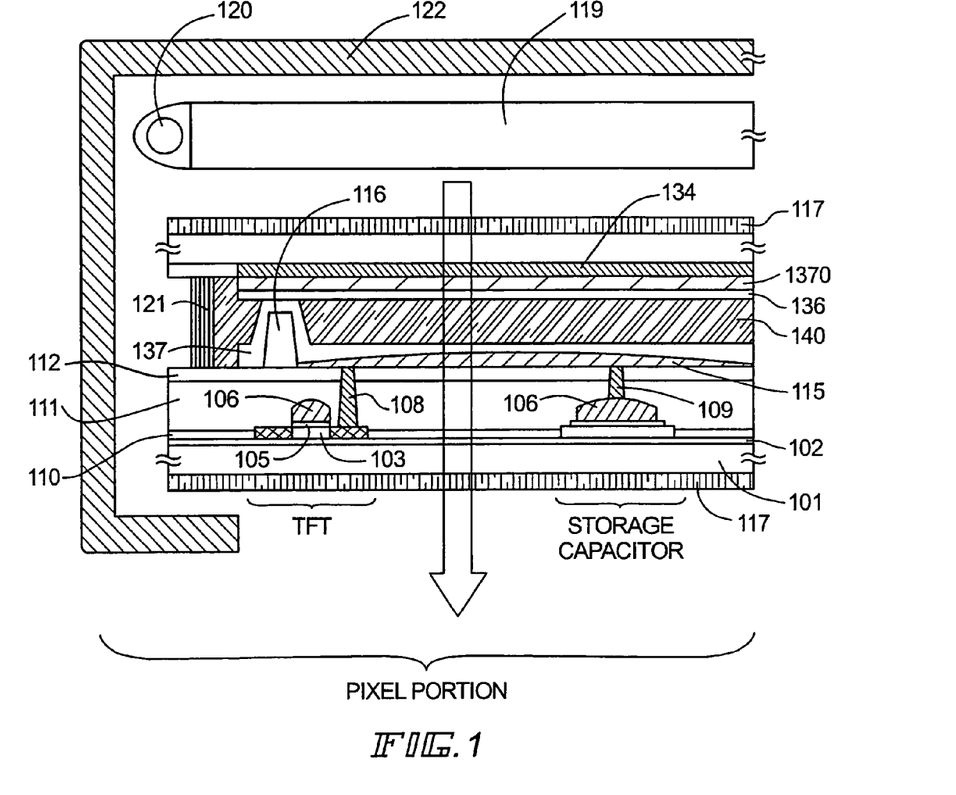
FIG. 1 is a cross sectional view showing a liquid crystal panel in accordance with one embodiment of the present invention.
Figure 7:
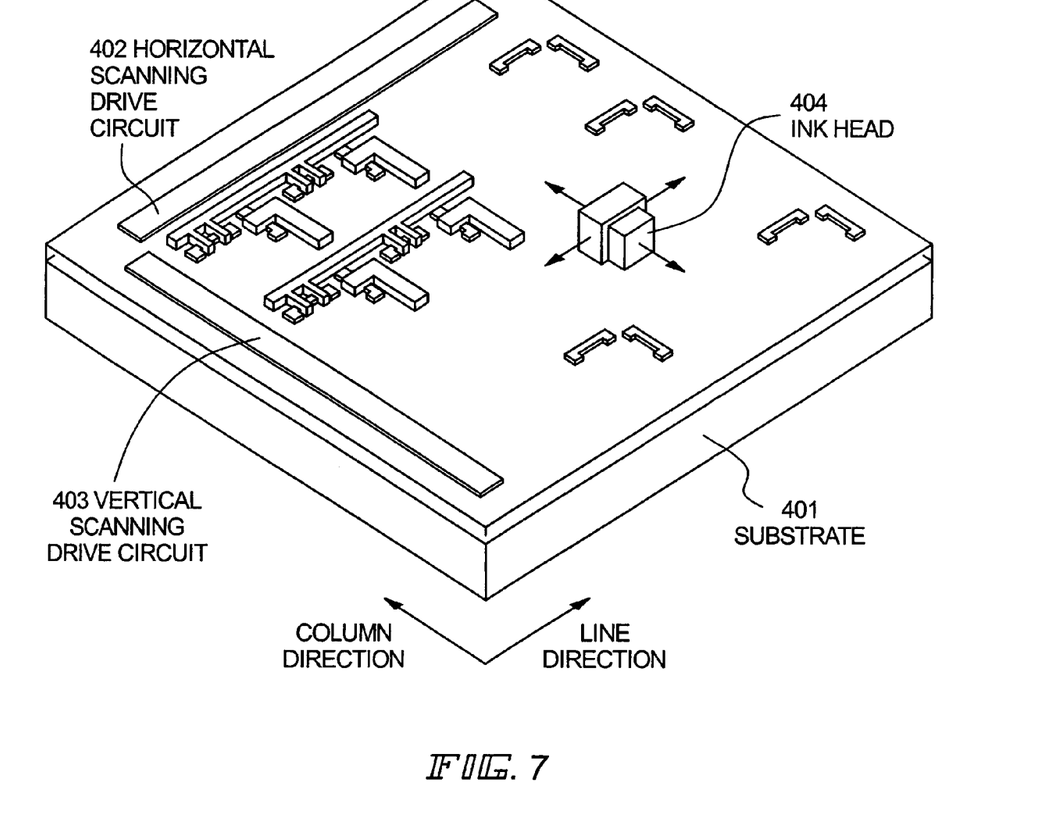
FIG. 7 is a perspective view showing a manufacturing method of the present invention.

In an embodiment mode of the present invention, a manufacturing step is described by using an active matrix liquid crystal display device as an example with reference to FIGS. 1 and 7.

First, an active matrix substrate is formed by using a substrate 101 that is transparent to light. The substrate with such a large area as 600 mm×720 mm, 680 mm×880 mm, 1000 mm×1200 mm, 1100 mm×1250 mm, 1150 mm×1300 mm, 1500 mm×1800 mm, 1800 mm×2000 mm, 2000 mm×2100 mm, 2200 mm×2600 mm, or 2600 mm×3100 mm may be preferably used for reducing a manufacturing cost. A substrate made of barium borosilicate glass, aluminoborosilicate glass, or the like, as typified by #7059 glass or #1737 glass produced by Corning Inc. can be used. In addition, a transparent substrate such as a quartz substrate or a plastic substrate can be used alternatively.

At first, as shown in FIG. 1, a base film 102 made of an insulating film is formed on the substrate 101 in this embodiment mode. A semiconductor layer 103 is formed over the base film 102. The semiconductor layer 103 is formed to be from 25 nm to 80 nm thick by a publicly known method (sputtering, LP CVD, plasma CVD or the like). In this embodiment mode, an amorphous silicon film of 50 nm in thickness is formed by plasma CVD. Subsequently, laser crystallization by an excimer laser is performed additionally to enhance the crystallinity. Doping (channel doping) of a very small amount of an impurity element (boron) may be performed to control the threshold value of a TFT after forming the semiconductor layer. After that, a resist is patterned by ink jetting. The semiconductor layer 103 is formed by dry etching by using the resist as a mask.

Then, a gate insulating film 105 for covering the semiconductor layer 103 is formed. The gate insulating film 105 is formed from an insulating film including silicon by plasma CVD or sputtering to have a thickness of from 40 nm to 150 nm. In this embodiment mode, a silicon oxynitride film is formed to have a thickness of 115 nm by plasma CVD as the gate insulating film (and a capacitor insulating film) 105.

Subsequently, a first conductive layer (a gate wiring, a gate electrode, a capacitor electrode) 106 is formed by ink jetting under reduced pressure or in vacuum. A perspective view of this state is shown in FIG. 7.

In FIG. 7, reference numeral 401 denotes a substrate, 402 denotes a horizontal scanning driver circuit, 403 denotes a vertical scanning driver circuit, and 404 denotes an ink head. A solution is applied by using one or plural ink heads 404 and scanning in parallel with the surface of the substrate 401 from side to side and up and down. According to the structure, wirings can be applied to only a desired portion.

Although the ink head having three nozzles is shown in FIG. 7, an ink head having one nozzle may be used. A plurality of ink heads each having a different nozzle diameter may be provided, and used appropriately depending on the application. Generally, an ink head has a nozzle diameter of from 50 μm to 100 μm. Although the throughput depends on the nozzle diameter, a plurality of nozzles may be arranged in parallel so as to have the same length as that of one row or one column to form by scanning once in consideration of the throughput. Alternatively, an arbitrary number of nozzles may be provided to scan plural times and plural times of scanning may be performed on the same portion for recoating. Further, the ink head 404 is preferably scanned, but the substrate 401 may be moved instead. The distance between the substrate 401 and the ink head 404 is preferably as short as possible so as to drop on a desired portion, specifically, appropriately from 0.1 mm to 2.0 mm.

The amount of the composition jetted (discharged) once from the ink head is preferably from 10 pl to 70 pl, the viscosity is preferably 100 cp or less, the grain size is preferably 0.1 μm or less. This prevents drying. Also, if the viscosity is too high, the composition may not be smoothly discharged from the ink head. Thus, the viscosity of the composition, the surface tension, and the drying rate are properly adjusted in accordance with the solvent to be used and the purpose. The composition discharged from the ink head is preferably formed in a linear shape or a stripe shape by subsequently dropping the composition on the substrate. However, the composition may be dropped onto the predetermined spots, per dot, for example.

As the composition jetted from an ink head, the one in which a conductive material that is properly selected from tantalum (Ta), tungsten (W), titanium (Ti), molybdenum (Mo), aluminum (Al), copper (Cu), chromium (Cr), or neodymium (Nd), an alloy material of the metal, a compound material mainly containing the metal and a AgPdCu alloy, is dissolved and dispersed in a solvent can be used. As the solvent, an organic solvent, for example, ester such as butyl acetate or ethyl acetate, alcohols such as isopropyl alcohol or ethyl alcohol, methyl ethyl ketone, or acetone, is used. The concentration of the solvent is properly determined according to the types of the conductive materials.

Ultra fine particles (nanometal grains) in which silver (Ag), gold (Au), or platinum (Pt) is dispersed into a solvent with a grain size of 10 nm or less may be used for the composition jetted from the ink head. The problem of the nozzle blocking can be solved by using the composition in which fine grains in a grain size are dispersed or dissolved in the solvent. The grain size of the constituent material of the composition is required to be smaller than the diameter of the nozzle in the present invention using an ink jetting method. Further, a conductive polymer such as polyethylene dioxythiophene/polystyrenesulfonic acid (PEDT/PSS) solution may be used instead.

The wiring resistance can be lowered when a low resistance metal such as silver or copper is used as a wiring material; thus, such a low resistance metal is preferably used when a large size substrate is used. Moreover, since these metal materials are difficult to process by a conventional dry etching method, it is extremely effective that patterning is directly performed thereon by ink jetting. However, in the case of using copper, a conductive film having a barrier function, which can prevent the diffusion of copper, is preferably provided so as not to have an adverse affect on the electric characteristic of a transistor. A wiring can be formed, without diffusing copper into the semiconductor included in a transistor by the conductive film having a barrier function. As the conductive film having a barrier function, one kind of or plural kinds of laminated films selected from tantalum nitride (TaN), titanium nitride (TiN), or tungsten nitride (WN) can be used. An oxidant inhibitor is preferably used at the same time since copper is easily oxidized.

Thereafter, the solvent is volatilized to enhance the density of the composition and reduce the resistance value by performing a heat treatment on the substrate over which the first conductive layer is formed within the range of from 150° C. to 300° C. in the normal pressure, under a reduced pressure, or in a vacuum. The solvent in the composition discharged from the ink head 404 is preferably the one which volatilizes after dropping the composition on the substrate. When the solvent having higher volatility such as toluene is used, the solvent is volatilized after dropping the composition on the substrate. In that case, the heat treatment step may be omitted. However, the solvent of the composition is not particularly limited, and in the case of using the solvent which volatilizes after the dropping, the density of the composition may be enhanced and the resistance value may be reduced by performing a heat treatment. The heat treatment may be performed, every time a thin film is formed by ink jetting, every optional step, or after finishing the whole steps.

A lamp annealing apparatus in which the substrate is directly and rapidly heated by using a lamp such as a halogen lamp as a heat source or a laser irradiation apparatus in which the substrate is irradiated with laser light is used for the heat treatment. A heat treatment can be performed only on the desired portion by scanning the heat source itself in the both apparatuses. As the other methods, an annealing furnace which is set at predetermined temperature may be used. When a lamp is used, light having a wavelength which dose not destroy the composition of the thin film to be heat-treated and which is capable of only heating, for example, light having a longer wavelength than 400 nm, namely, light having the longer wavelength than that of the infrared light is preferably used. In consideration of the handling, a far-infrared ray (the typical wavelength is from 4.0 μm to 25 μm) is preferably used. When laser light is used, the beam spot on the substrate of the laser light emitted from the laser oscillator is preferably formed to have a linear shape so as to have the same length as that of the row or column of the substrate. And the laser irradiation can be finished by scanning once. In the embodiment mode, the substrate is irradiated with laser light having a beam spot having a linear shape as the heat treatment.

Subsequently, an impurity element imparting a conductive type of n-type or p-type is doped into the semiconductor layer 103 by using the gate electrode 106 as a mask. At the same time, a region which is not doped with any impurity elements or doped with a small amount of impurity elements (which is generically referred to as a channel formation region) is formed. Further, a portion of the gate insulating film is etched and removed by using the first conductive layer 106 as a mask, thereby exposing the surface of the semiconductor layer 103 in the impurity region.

Thereafter, as shown in Embodiments 1 and 2, a conductive film such as an Al film with a thickness of 1.5 μm is deposited over the entire surface once, and a resist pattern is formed on a desired particular region of the conductive film by ink jetting, and then, pillars 108 and 109 made of Al are formed by anisotropic dry etching. A first interlayer insulating film 110 made of an insulating film is formed. A silicon oxynitride film is formed to be 100 nm thick by plasma CVD as the first interlayer insulating film 110. Then, a second interlayer insulating film 111 is formed over the first interlayer insulating film 110. A transparent acrylic film may be formed to be 1.6 μm thick over the entire surface by spin coating as the second interlayer insulating film 111. A silicon nitride film is formed to be 50 nm thick as a third interlayer insulating film 112. It should be noted that the interlayer insulating films are not limited to the above described materials.

The third interlayer insulating film (such as silicon nitride film) 112, the second interlayer insulating film (such as acrylic film) 111, and the first interlayer insulating film (such as a silicon oxynitride film) 110 are sequentially etched back, thereby exposing top portions of the pillars 108 and 109.

After that, second conductive layers (source wiring, drain wiring) may be formed to be in contact with the conductor pillar 108 and 109 by ink jetting. (not shown) It is required to set the viscosity of composition to be jetted to an optimum value.

Then, a pixel electrode 115 made of a transparent conductor is formed over the entire surface so that it is electrically connected to the conductor pillar (or, the second conductive layer in the case of forming the second conductive layer). As an example of the pixel electrode 115, a compound of indium oxide and tin oxide (ITO), a compound of indium oxide and zinc oxide, zinc oxide, tin oxide, indium oxide, titanium nitride and the like can be given. In this embodiment mode, an ITO film is formed to have a thickness of 0.1 μm by ink jetting as the pixel electrode 115.

As described above, an active matrix substrate comprising a pixel portion that has a source wiring, a TFT of the pixel portion and a storage capacitor, and a terminal portion can be manufactured.

An orientation film 137 is formed over the active matrix substrate and a rubbing treatment is performed thereto. In this embodiment mode, before forming the orientation film 137, a columnar spacer 116 for keeping the substrate interval is formed in the desired position by patterning an organic resin film such as an acrylic resin film. Instead of the columnar spacer, a spherical spacer may be applied to the whole surface of the substrate.

An opposite substrate is prepared. The opposite substrate is provided with a color filter 134 in which a colored layer and a light-shielding layer (not shown) are arranged in accordance with each pixel. In addition, a planarization film is provided so as to cover the color filter and the light-shielding layer. Then, an opposite electrode 1370 formed of a transparent conductive film is formed over the planarization film so as to overlap with the pixel portion. The orientation film 136 is formed over the whole surface of the opposite substrate, and a rubbing treatment is performed thereto.

After applying a sealant so as to surround the pixel portion of the active matrix substrate, a liquid crystal 140 is jetted over the region surrounded by the sealant under reduced pressure by ink jetting. The active matrix substrate and the opposite substrate are bonded with the sealant 121 under reduced pressure without being exposed to the air. A filler (not shown) is mixed into the sealant 121. Therefore, the two substrates are bonded with an even interval by the filler and the columnar spacer 116. According to the method that the liquid crystal is jetted by ink jetting, the amount of the liquid crystal used in the manufacturing steps can be reduced, and the cost required in the case of using a large size substrate can be widely reduced.

Thereupon, in this embodiment mode, the substrate is bonded to the opposite substrate provided with the sealant after the liquid crystal material is jetted (or dropped) only over the pixel electrode that are formed over the substrate by ink jetting, that is, over the pixel portion. Both of applying the sealant and dropping of the liquid crystal may be performed on the opposite substrate or on the substrate provided with the pixel portion.

A piezo system that is applied for ink-jet printers may be employed for an ink jetting method since controllability of an ink drop is higher and the kind of an ink can be selected freely. Note that, the piezo system has two types: a MLP (Multi Layer Piezo) type and a ML Chip (Multi Layer Ceramic Hyper Integrated Piezo Segments).

In this embodiment mode, a liquid crystal display device can be manufactured by discharging (or dropping) plural drops of a small amount of liquid crystal toward a pixel electrode. By employing an ink jetting method, the small amount of the liquid crystal can be freely adjusted by the number of jetting and the number of the jetting point.

Thus, an active matrix liquid crystal display device can be manufactured. Note that, if necessary, the active matrix substrate or the opposite substrate is sectioned to have a desired shape. Further, an optical film such as a polarizing plate 117 is provided appropriately by using known techniques. An FPC is further bonded by using known techniques.

A liquid crystal module obtained according to the above steps is provided with a backlight 120 and an optical waveguide 119. The active matrix liquid crystal device (transmissive type) is completed by covering the liquid crystal module with a cover 122. A part of the cross section thereof is shown in FIG. 1. Note that, the cover and the liquid crystal module are fixed with an adhesive or an organic resin. The polarizing plate 117 is bonded to the both of the active matrix substrate and the opposite substrate, since the liquid crystal display device is a transmissive type.

Further, an example of the transmissive type is shown in this embodiment mode; however, the present invention is not limited thereto, and a reflective or semi-transparent liquid crystal display device can also be manufactured according to the present invention. When a reflective liquid crystal display device is obtained, a metal film with high reflectance, typically, a material film containing aluminum or silver mainly, or a lamination thereof may be used for a pixel electrode.

There are mainly two types of liquid crystal display devices: a passive type (simple matrix type) and an active type (active matrix type); the present invention can be applied to the either of the types.

This embodiment mode is not limited to the above described examples, and can be applied to various applications unless it departs from the scope of the present invention.

Embodiment 1

Embodiment 1 of the present invention is described in detail with reference to FIGS. 2A to 2D and FIGS. 3A to 3C. In the present invention, a liquid crystal display device is manufactured by a patterning treatment using an ink jetting method, without performing a conventional patterning treatment using a photolithography method. Note that, the present invention is not limited to the following description, since it is to be understood that various changes and modifications will be apparent to those skilled in the art, unless such changes and modifications depart from the scope and purpose of the present invention. Therefore, the present invention should not be limited to the embodiment to be described hereinafter. Note that, in structures to be described hereinafter of the present invention, the same reference numeral for showing the same elements are used commonly in the figures. Hereinafter, a step of manufacturing an n-channel TFT (for switching) and a capacitor over the same substrate is described, according to the present invention.

Figure 2A:
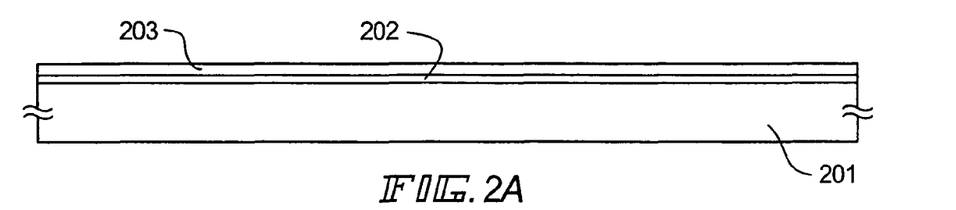
FIGS. 2A to 2D are cross sectional views showing a method for manufacturing a liquid crystal panel according to the present invention.
Figure 3A:
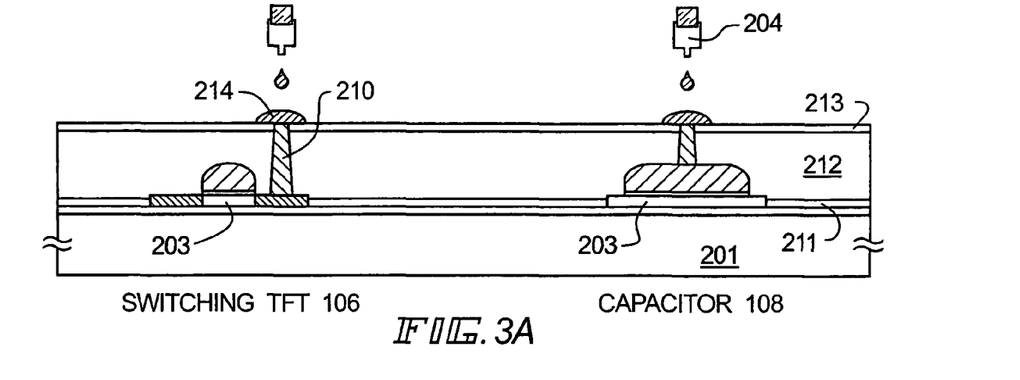
FIGS. 3A to 3C are cross sectional views showing a method for manufacturing a liquid crystal panel according to the present invention.

A flexible substrate typified by a glass substrate and a plastic substrate, or the like, which can withstand the processing temperature of the steps, is used for a substrate 201 (FIG. 3A). In this embodiment, a glass substrate is used. A base film 202 made of an insulating film is formed on the substrate 201. The base film 202 may be either of a single layer or laminated layers. In this embodiment, the base film has a two-layer structure. A silicon nitride oxide film with the film thickness of 50 nm is formed for a first layer and a silicon oxynitride film with the film thickness of 50 nm is formed for the second layer by sputtering for the two-layer structure of the base film. Then the surface is flattened by CMP, or the like (FIG. 2A).

Figure 2B:
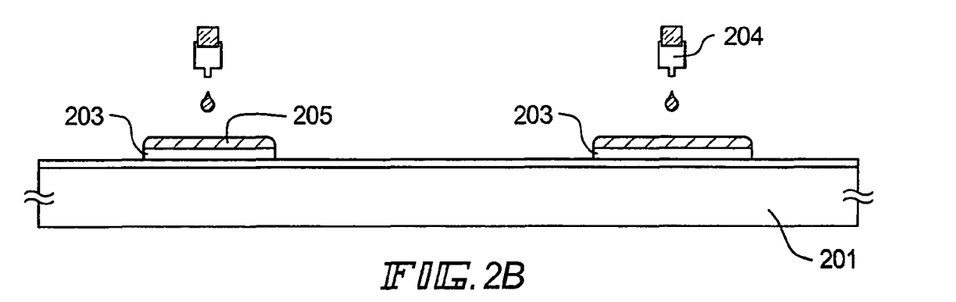

Subsequently, a semiconductor layer 203 is formed over the base film 202. As the semiconductor layer 203, a semiconductor film is formed with a thickness of from 25 nm to 80 nm by a known method (such as sputtering, LPCVD, plasma CVD). Then, the semiconductor film is crystallized by a known crystallization method (laser crystallization, RTA thermal crystallization using annealing furnace, thermal crystallization using a metal element that promotes crystallization, or the like). Then, the obtained crystalline semiconductor film is patterned into a desired shape to form the semiconductor layer 203. Note that, an amorphous semiconductor film, a microcrystalline semiconductor film, a crystalline semiconductor film, a compound semiconductor film with an amorphous structure such as an amorphous silicon germanium film, or the like may be used as the semiconductor film.

In this embodiment, a 50-nm-thick amorphous silicon film is formed by plasma CVD. Then, a solution containing nickel is applied and held over the amorphous silicon film, dehydrogenation (500° C. for 1 hour) is performed on the amorphous silicon film, and then, thermal crystallization (550° C., 4 hours) is conducted thereto, thereby forming a crystalline silicon film. Thereafter, a resist 205, which is discharged from an ink jet nozzle 204 by ink jetting, is exposed to pattering, and the semiconductor layer 203 is formed by dry etching using the resist pattern as a mask (FIG. 2 B).

Note that, a continuous wave or pulsed gas laser or solid-state laser may be employed, as a laser used in the case where the crystalline semiconductor film is formed by laser crystallization. As the former gas laser, an excimer laser or the like is used. Also, as the latter solid-state laser, a laser which uses crystals such as YAG, $YVO_4$, or the like which is doped with Cr, Nd or the like is used. Note that, in crystallization of the amorphous semiconductor film, it is preferable that the solid-state laser capable of continuously oscillating be used and that the oscillation of any one of the second harmonic wave through the fourth harmonic wave with respect to the fundamental wave be applied in order to obtain crystals with a large grain size. In the case of using the above lasers, the laser beam emitted from a laser oscillator is condensed in a linear shape by an optical system, and the semiconductor film is preferably irradiated with the laser beam.

However, in this embodiment, since the crystallization of the amorphous silicon film is conducted by using a metal element that promotes crystallization, the metal element remains in the crystalline silicon film. Therefore, an amorphous silicon film with a thickness of from 50 nm to 100 nm is formed over the crystalline silicon film, and a heat treatment (such as RTA or thermal annealing using an annealing furnace) is performed thereon to diffuse the metal element into the amorphous silicon film. After the heat treatment, the amorphous silicon film is removed by etching. As a result, the metal element content of the crystalline silicon film can be reduced or eliminated. After forming the semiconductor layer 203, a minute amount of impurity elements (boron) may be doped (channel doping) in order to control the threshold value of a TFT.

Figure 2C:
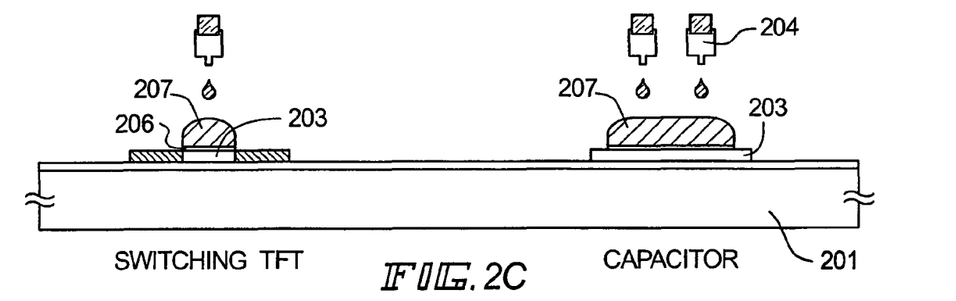

Then, a gate insulating film 206 for covering the semiconductor layer 203 is formed. The gate insulating film 206 is formed of an insulating film including silicon by plasma CVD or sputtering to have a thickness of from 40 nm to 150 nm. In this embodiment, a silicon oxynitride film is formed to have a thickness of 115 nm by plasma CVD as the gate insulating film.

Subsequently, the first conductive layer (a gate wiring, a gate electrode, a capacitor electrode) 207 is formed by ink jetting under reduced pressure or in vacuum (FIG. 2C). A perspective view of this stage is shown in FIG. 7.

In FIG. 7, reference numeral 401 denotes a substrate, 402 denotes a horizontal scanning driver circuit, 403 denotes a vertical scanning driver circuit, and 404 denotes an ink head(s). Solution is applied by using one or plural ink heads 404 and scanning in parallel with the surface of the substrate 401 from side to side and up and down. According to the structure, wirings can be applied to only a desired portion.

Although the ink head having three nozzles is shown in FIG. 7, an ink head having one nozzle may be used. A plurality of ink heads each having different nozzle diameter are provided, and used appropriately depending on the application. Generally, an ink head has a nozzle diameter of from 50 μm to 100 μm. Although the throughput depends on the nozzle diameter, a plurality of nozzles may be arranged in parallel so as to have the same length as that of one row or one column to form by scanning once in consideration of the throughput. Alternatively, an arbitrary number of nozzles may be provided to scan plural times and plural times of scanning may be performed on the same portion for recoating. Further, the ink head 404 is preferably scanned, but the substrate 401 may be moved instead. The distance between the substrate 401 and the ink head 404 is preferably as short as possible so as to drop on a desired portion, specifically, appropriately from 0.1 mm to 2.0 mm.

Preferably, the amount of composition jetted once from the ink head is preferably from 10 pl to 70 pl, the viscosity is preferably 100 cp or less, the grain size is preferably 0.1 μm or less. This is because the viscosity is too high to apply the composition smoothly from the ink head. And the above conditions can prevent drying out. Thus, the viscosity of the composition, the surface tension, and the drying rate are properly adjusted in accordance with the solvent to be used and the purpose. The composition discharged from the ink head is preferably formed in a linear shape or a stripe shape by subsequently dropping the composition on the substrate. However, the composition may be dropped onto the predetermined spots, per dot, for example.

As the composition jetted from an ink head, the one in which a conductive material that is properly chosen from an element selected from tantalum (Ta), tungsten (W), titanium (Ti), molybdenum (Mo), aluminum (Al), copper (Cu), chromium (Cr), or neodymium (Nd), an alloy material or compound material mainly containing the above element, or a AgPdCu alloy, is dissolved and dispersed in a solvent can be used. As the solvent, an organic solvent, for example, ester such as butyl acetate, or ethyl acetate, alcohols such as isopropyl alcohol or ethyl alcohol, methyl ethyl ketone, or acetone, is used. The concentration of the solvent is properly determined according to the types of the conductive materials.

Ultra fine particles (nanometal grains) in which silver (Ag), gold (Au), or platinum (Pt) is dispersed into a solvent with a grain size of at most 10 nm may be used for the composition jetted form the ink head. The problem of the nozzle blocking may be solved by using the composition in which fine grains in grain size are dispersed or dissolved in the solvent. The grain size of the constituent material of the composition is required to be smaller than the diameter of the nozzle in the present invention using an ink jetting method. Further, a conductive polymer such as polyethylene dioxythiophene/polystyrenesulfonic acid (PEDT/PSS) solution may be used instead.

The wiring resistance can be lowered when a low resistance metal such as silver or copper is used as a wiring material; thus, such a low resistance metal is preferably used when a large size substrate is used. Moreover, since these metal materials are difficult to process by a conventional dry etching method, it is extremely effective that patterning is directly performed thereon by ink jetting. However, in the case of using copper, a conductive film having a barrier function, which can hinder diffusion of the copper, is preferably provided so as not to have an adverse affect on the electric characteristic of a transistor. A wiring can be formed, without diffusing copper into the semiconductor included in a transistor by the conductive film having a barrier function. As the conductive film having a barrier function, one kind of or plural kinds of laminated films selected from tantalum nitride (TaN), titanium nitride (TiN), or tungsten nitride (WN) can be used. An oxidant inhibitor is preferably used at the same time since copper is easily oxidized.

Thereafter, the solvent is volatilized to enhance the density of the composition and reduce the resistance value by performing a heat treatment on the substrate over which the first conductive layer is formed within the range of from 150° C. to 300° C. in normal pressure, under reduced pressure, or in vacuum. The solvent in the composition jetted from the ink head 204 is preferably the one which volatilizes after dropping the composition on the substrate. When the solvent having higher volatility such as toluene is used, the solvent is volatilized after dropping the composition on the substrate. In that case, the heat treatment step may be omitted. However, the solvent of the composition is not particularly limited, and in the case of using the solvent which volatilizes after the dropping, the density of the composition may be enhanced and the resistance value may be reduced by performing a heat treatment. The heat treatment may be performed every time a thin film is formed by ink jetting or every optional step, or after finishing the whole steps.

A lamp annealing apparatus in which the substrate is directly and rapidly heated by using a lamp such as a halogen lamp as a heat source or a laser irradiation apparatus in which the substrate is irradiated with a laser light is used for the heat treatment. A heat treatment can be performed only on the desired portion by scanning the heat source itself in the both apparatuses. As the other methods, an annealing furnace which is set at predetermined temperature may be used. When a lamp is used, light having a wavelength which dose not destroy the composition of the thin film to be heat-treated and which is capable of only heating, for example, light having a longer wavelength than 400 nm, namely, light having the longer wavelength than that of the infrared light is preferably used. In consideration of the handling, a far-infrared ray (the typical wavelength is from 4.0 μm to 25 μm) is preferably used. When laser light is used, the beam spot on the substrate of the laser light emitted from the laser oscillator is preferably formed to have a linear shape so as to have the same length as that of the row or column of the substrate. And the laser irradiation can be finished by scanning once. In this embodiment, the substrate is irradiated with a laser light having a beam spot of a linear shape as the heat treatment.

Subsequently, an impurity element imparting a conductive type of n-type or p-type is doped into the semiconductor layer 203 by using the gate electrode 207 as a mask. In this embodiment, an impurity element imparting n-type is added into the semiconductor layer 203, or an impurity element imparting p-type is added into the semiconductor layer 203, thereby forming an impurity region. At the same time, a region which is not doped with any impurity elements or doped with a small amount of impurity elements (which is generally called as a channel formation region) is formed. Further, a portion of the gate insulating film is etched and removed by using the gate electrode 205 as a mask, thereby exposing the surface of the semiconductor layer in the impurity region (FIG. 2C).

Figure 2D:
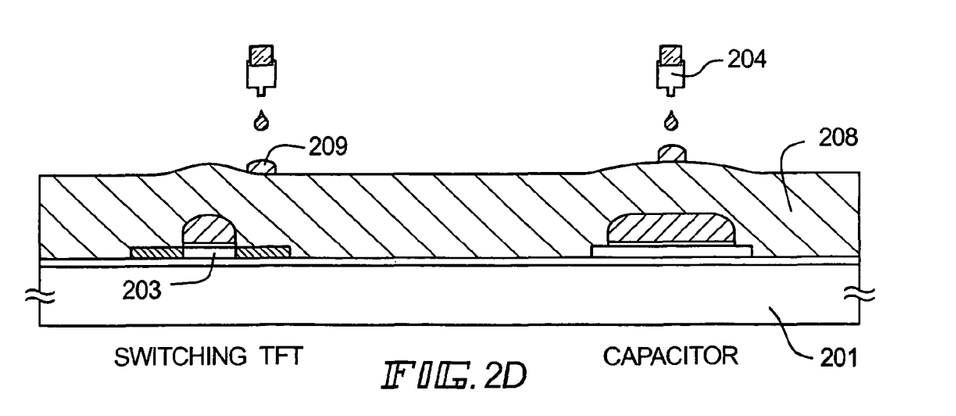

Thereafter, a thick conductive film 208 is deposited once, and a resist pattern 209 is formed on a particular portion of the conductive film by ink jetting. For the conductive film, a metal such as Al, Ti, or TiN, carbon, an organic material having conductivity or the like can be also used appropriately. Alternatively, for the material of the resist pattern 209, a metal material, an inorganic material such as $SiO_2$ can be used instead of a conventional organic material. In particular, when the metal material is used, it is unnecessary to remove the metal element after processing a pillar to be described below. A metal material having selectivity in etching processing of pillar can be used for the metal material. For example, a noble metal such as Au, Ag, Cu, or Pt which can be hard to be etched by dry etching can be also used (FIG. 2D).

Subsequently, a conductor pillar 210 is formed by anisotropic dry etching with the resist pattern 209 as a mask. A first interlayer insulating film 211 made of an insulating film is formed. The first interlayer insulating film 211 is formed from an insulating film including silicon to be from 50 nm to 200 nm thick by plasma CVD or sputtering. In this embodiment, a 100-nm-thick silicon oxynitride film is formed as the first interlayer insulating film 211 by plasma CVD.

Then, a second interlayer insulating film 212 is formed over the first interlayer insulating film 211. A silicon oxide film formed by CVD, a silicon oxide film applied by a SOG (Spin On Glass) method or spin coating, an organic insulating film such as acrylic or a non-photosensitive organic insulating film, each of which is from 0.7 μm to 5.0 μm thick, is used for the second interlayer insulating film 212. An acrylic film of 1.6 μm thick is formed by CVD in this embodiment. It is noted that the second interlayer insulating film 212 is provided for the sake of smoothing unevenness due to a TFT formed over the substrate 200 and leveling the surface, and thus, a film having a leveling property is favorable. Further, a silicon nitride film is formed to be 0.1 μm thick as a third interlayer insulating film 213.

The third interlayer insulating film (such as silicon nitride film) 213, the second interlayer insulating film (such as acrylic film) 212, and the first interlayer insulating film (such as a silicon oxide film) 211 are sequentially etched back, thereby exposing a top portion of the conductor pillar 210. After that, the second conductive layer (source wiring, drain wiring) 214 is formed to be in contact with the conductor pillar 210 by ink jetting. FIG. 3A shows a cross sectional view of the state.

The second conductive layer is formed to be a single layer or a laminate by using the composition in which a conductive material is dissolved or dispersed in a solution as the composition jetted from the ink head, like the first conductive layer. In the case of forming the second conductive layer, it is necessary that the viscosity of the composition to be jetted should be set to a suitable value. In this embodiment, a second conductive layer 214 has a two layer structure, in which a first layer is made of titanium and a second layer is made of silver. Then, a heat treatment is performed. A transistor is formed over the substrate 201 having an insulating surface according to the above described steps.

Figure 3B:
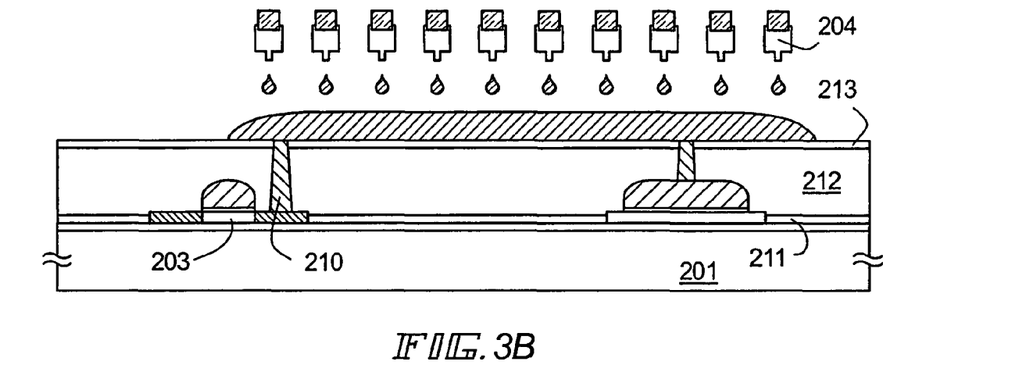

Then, a pixel electrode 215 made of a transparent conductor is formed over the entire surface so that it is electrically connected to the second conductive layer 214 (FIG. 3B). As an example of the pixel electrode 215, a compound of indium oxide and tin oxide (ITO), a compound of indium oxide and zinc oxide, zinc oxide, tin oxide, indium oxide, titanium nitride and the like can be given. In this embodiment, an ITO film is formed to have a thickness of 0.1 μm by ink jetting as the pixel electrode 215 (FIG. 3B).

As described above, an active matrix substrate comprising a pixel portion that has a source wiring, a TFT of the pixel portion and a storage capacitor, and a terminal portion can be manufactured.

Figure 3C:
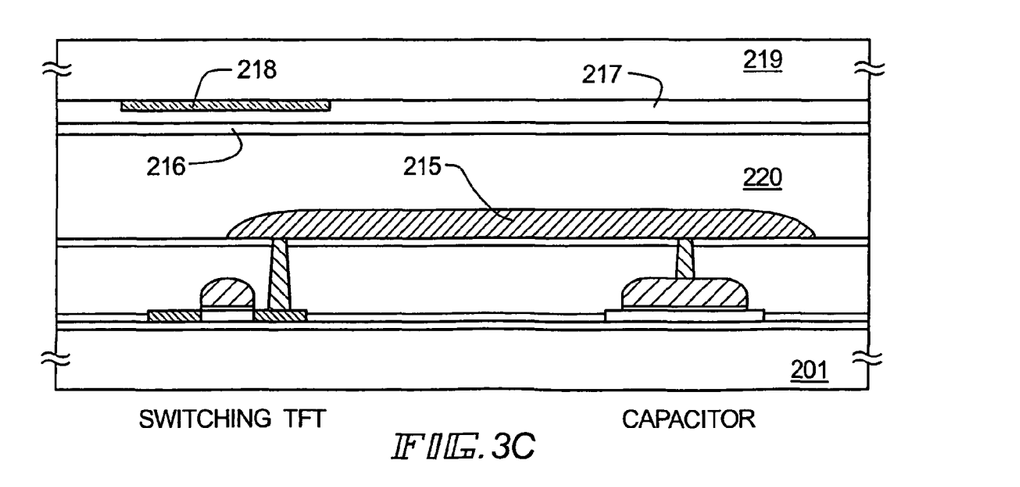

After that, an opposite substrate 219 where a common electrode 216, a color filter 217, a black matrix 218, and the like have been formed, is bonded. Then, a liquid crystal 220 is injected by a predetermined method to complete a liquid crystal display device (FIG. 3C). Note that, steps of equipping back light and the like are omitted here.

As described above, Embodiment 1 of the present invention is described about an active matrix liquid crystal display device. However, the present invention is not limited to this embodiment and can similarly be applied based on the scope of the present invention. For example, the present invention can be applied to an active matrix organic EL display device, as shown in Embodiment 2. The materials or the formation steps described in this embodiment can be used appropriately and selectively in accordance with the scope of the present invention.

Embodiment 2

Embodiment 2 of the present invention is described in detail with reference to FIGS. 4A to 4D, FIGS. 5A to 5D and FIGS. 6A to 6C. In the present invention, an EL display device is manufactured by a patterning treatment using an ink jetting method, without performing a conventional patterning treatment using a photolithography method. Note that, the present invention is not limited to the following description, since it is to be understood that various changes and modifications will be apparent to those skilled in the art, unless such changes and modifications depart from the scope and purpose of the present invention. Therefore, the present invention should not be limited to the embodiment to be described hereinafter. Note that, in structures of the present invention, the same reference numeral for showing the same elements are used commonly in the figures. Hereinafter, a manufacturing step of an EL display device where an n-channel TFT (for switching) and two p-channel TFTs (for driving) are formed on the same substrate, according to the present invention, is described.

Figure 4A:
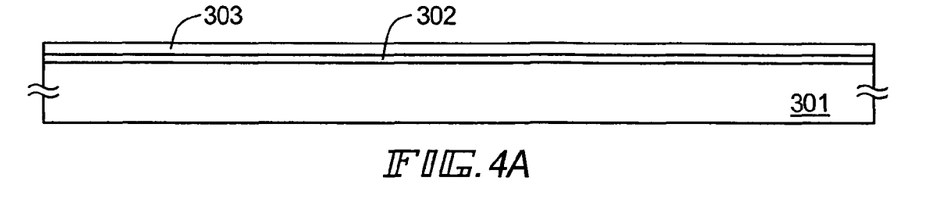
FIGS. 4A to 4D are cross sectional views showing a method for manufacturing an EL panel according to the present invention.

A flexible substrate typified by a glass substrate and a plastic substrate, or the like, which can withstand the processing temperature of the steps, is used for a substrate 301 (FIG. 2A). In this embodiment, a glass substrate is used. A base film 302 made of an insulating film is formed on the substrate 301. The base film 302 may be either of a single layer or laminated layers. In this embodiment, the base film has a two-layer structure. A silicon nitride oxide film with the film thickness of 50 nm is formed for a first layer and a silicon oxynitride film with the film thickness of 50 nm is formed for a second layer by sputtering for the two-layer structure of the base film. Then the surface is flattened by CMP, or the like (FIG. 4A).

Subsequently, a semiconductor layer 303 is formed over the base film 302. As the semiconductor layer 303, a semiconductor film is formed with a thickness of from 25 nm to 80 nm by a known method (such as sputtering, LPCVD, plasma CVD). Then, the semiconductor film is crystallized by a known crystallization method (laser crystallization, RTA, thermal crystallization using an annealing furnace, thermal crystallization using a metal element that promotes crystallization, or the like). Then, the obtained crystalline semiconductor film is patterned into a desired shape to form the semiconductor layer 303. Note that, an amorphous semiconductor film, a microcrystalline semiconductor film, a crystalline semiconductor film, a compound semiconductor film with an amorphous structure such as an amorphous silicon germanium film, or the like may be used as the semiconductor film.

Figure 4B:
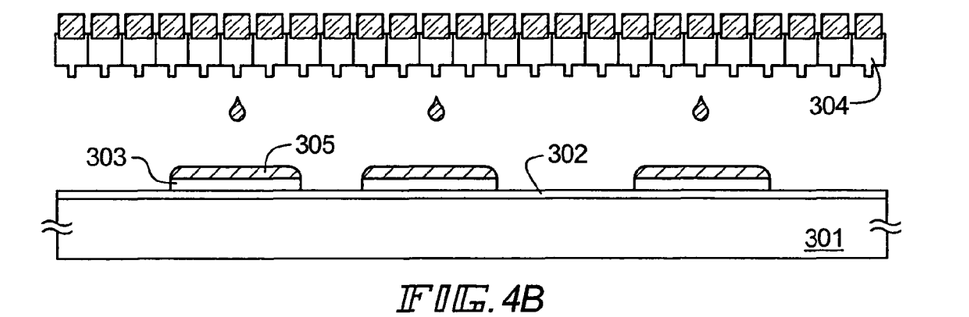

As in Embodiment 1, a 50-nm-thick amorphous silicon film is formed by using plasma CVD. Then, a solution containing nickel is applied and held over the amorphous silicon film, dehydrogenation (500° C. for 1 hour) is performed on the amorphous silicon film, and then, thermal crystallization (550° C., 4 hours) is conducted thereon, thereby forming a crystalline silicon film. Thereafter, a resist 305, which is discharged from an ink jet nozzle 304 by ink jetting, is exposed to pattering, and the semiconductor layer 303 is formed by dry etching by using the resist pattern as a mask (FIG. 4B).

Figure 4C:
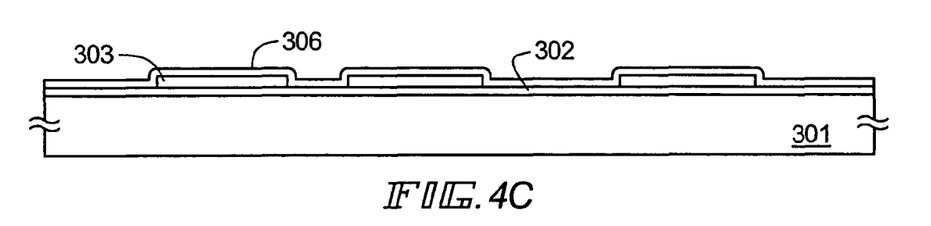

Thereafter, a gate insulating film 306 is formed. A silicon oxynitride film is formed to be 115 nm thick by plasma CVD as the gate insulating film 306 (FIG. 4C).

Figure 4D:
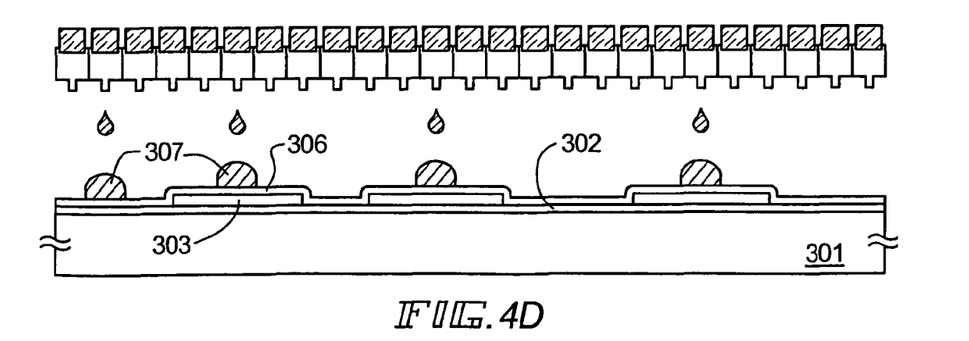

A first conductive layer (gate wirings, a gate electrode) 307 is formed under reduced pressure or in vacuum by ink jetting (FIG. 4D).

Thereafter, the solvent is volatilized to obtain favorable electric conductive properties by performing a heat treatment on the substrate over which the first conductive layer is formed within the range of from 150° C. to 300° C. in normal pressure, under reduced pressure, or in vacuum. The solvent in the composition jetted from the ink head nozzle 304 is preferably the one which volatilizes after dropping the composition on the substrate. When the solvent having higher volatility such as toluene is used, the solvent is volatilized after dropping the composition on the substrate. In that case, the heat treatment step may be omitted. However, the solvent of the composition is not particularly limited, and in the case of using the solvent which volatilizes after the dropping, the viscosity of the composition may be reduced to obtain the desired viscosity value by performing a heat treatment. The heat treatment may be performed every time a thin film is formed by ink jetting or every optional step, or after finishing the whole steps.

Subsequently, an impurity element imparting a conductive type of n-type or p-type is doped into the semiconductor layer 303 by using the gate electrode 307 as a mask. In this embodiment, an impurity element imparting n-type is added into the semiconductor layer 303, or an impurity element imparting p-type is added into the semiconductor layer 303, thereby forming an impurity region. At the same time, a region which is not doped with any impurity elements or doped with a small amount of impurity elements (which is generically named as channel formation region) is formed. Further, a portion of the gate insulating film is etched and removed by using the gate electrode 307 as a mask, thereby exposing the surface of the semiconductor layer 303 in the impurity region.

Figure 5A:
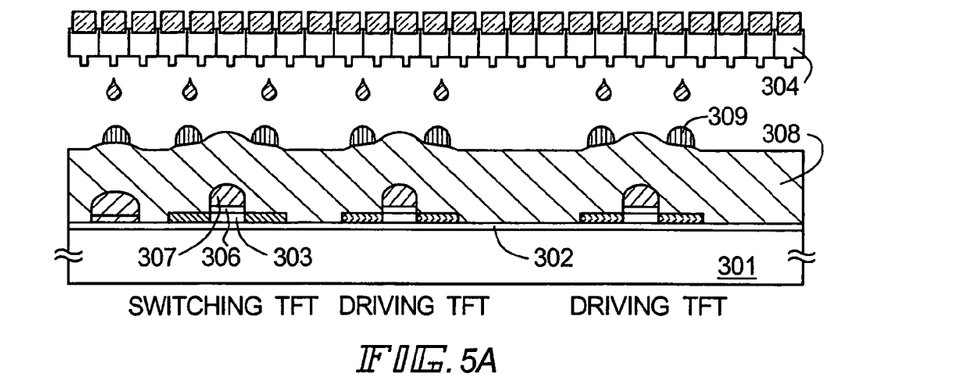
FIGS. 5A to 5D are cross sectional views showing a method for manufacturing an EL panel according to the present invention.

Thereafter, a thick conductive film 308 is deposited once, and a resist pattern 309 is formed on a desired particular portion of the conductive film 308 by ink jetting. For the conductive film 308, a metal such as Al, Ti, or TiN, carbon, an organic material having conductivity or the like can be also used appropriately.

Subsequently, a pillar 310 is formed by anisotropic dry etching by using the resist pattern 309 as a mask. A first interlayer insulating film 311 made of an insulating film is formed. The first interlayer insulating film 311 is formed from an insulating film including silicon to be from 50 nm to 200 nm thick by plasma CVD or sputtering. In this embodiment, a 100-nm-thick silicon oxynitride film is formed by plasma CVD.

Figure 5B:
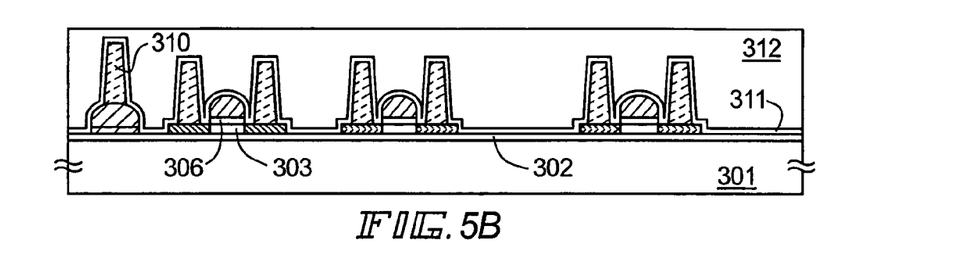

Then, a second interlayer insulating film 312 is formed over the first interlayer insulating film (a silicon oxynitride film) 311. A silicon oxide film formed by CVD, a silicon oxide film applied by a SOG (Spin On Glass) method or spin coating, an organic insulating film such as acrylic or a non-photosensitive organic insulating film, each of which is from 0.7 μm to 5.0 μm thick, may be used for the second interlayer insulating film 312. An acrylic film of 1.6 μm thick is formed by CVD in this embodiment. It is noted that the second interlayer insulating film 312 is provided for the sake of smoothing unevenness due to a TFT formed over the substrate 301 and leveling the surface, and thus, a film having a leveling property is favorable (FIG. 5B).

The first to third interlayer insulating films 311, 312 and 315 are each provided to obtain a blocking effect for preventing penetration of oxygen, moisture in the air and various ionic impurities.

Figure 5C:
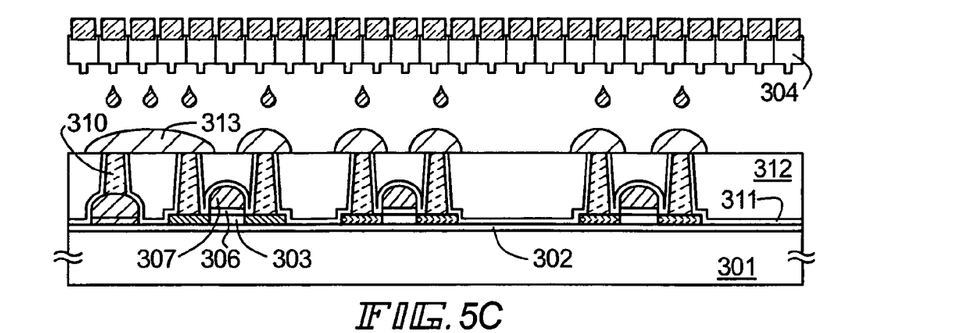

The second interlayer insulating film (such as acrylic film) 312, and the first interlayer insulating film (such as a silicon oxynitride film) 311 are sequentially etched back, thereby exposing a top portion of the pillar 310. After that, a second conductive layer (source wiring, drain wiring) 313 is formed to be in contact with the pillar 310 by ink jetting. FIG. 5C shows a cross sectional view of the state.

A second conductive layer 313 is formed to be a single layer or a laminate by using a composition in which a conductive material is dissolved or dispersed in a solution as the composition jetted from the ink head, like the first conductive layer. In this embodiment, the second conductive layer 312 has a two layer structure, in which a first layer is made of titanium and a second layer is made of Cu (copper). Then, a heat treatment is performed.

Thereafter, a thick conductive film is deposited once, and a resist pattern is formed on a desired particular region of the conductive layer by ink jetting. A pillar 314 is formed by anisotropic dry etching by using the resist pattern as a mask. Similarly, for the conductive film, a metal such as Al, Ti, or TiN, carbon, an organic material having conductivity or the like can be also used appropriately. Alternatively, for the resist material, a metal material, an inorganic material such as $SiO_2$ can be used instead of a conventional organic material. In particular, when the metal material is used, it is unnecessary to remove the metal element after processing a pillar to be described below. A metal material having selectivity in etching processing of a pillar can be used for the metal element. For example, a noble metal such as Au, Ag, Cu, or Pt which can be hard to be etched by dry etching in particular can be also used, in general.

Figure 5D:
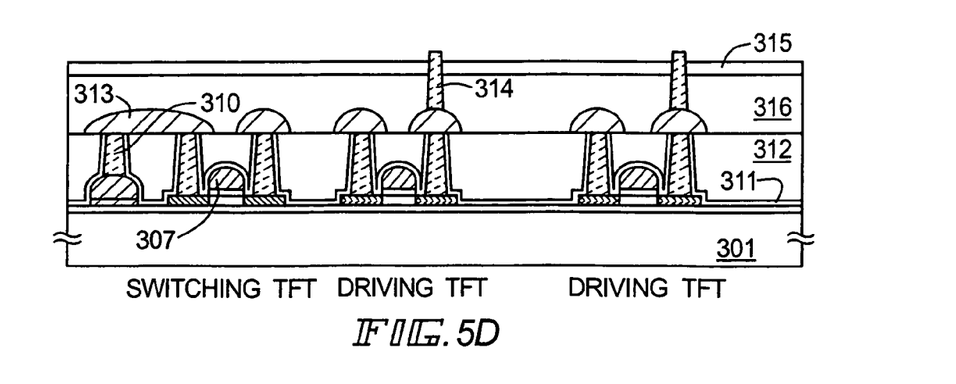

Then, a third interlayer insulating film 316 is formed over the entire surface. A silicon nitride film or silicon nitride oxide film of from 0.1 μm to 0.2 μm thick is formed by sputtering as the third interlayer insulating film 316. In this embodiment, a 0.1 μm thick silicon nitride film is formed by sputtering as the third interlayer insulating film 316. A blocking effect for preventing penetration of oxygen, moisture in the air and various ionic impurities can be obtained by providing the third interlayer insulating film 316. Further, a fourth interlayer insulating film 315 is formed over the entire surface. A silicon oxide film formed by CVD, a silicon oxide film applied by a SOG (Spin On Glass) method or spin coating, an organic insulating film such as acrylic or a non-photosensitive organic insulating film, each of which is from 0.7 to 5.0 μm thick, is used for the fourth interlayer insulating film 315. An acrylic film of 1.6 μm thick is formed by spin coating in this embodiment. A film having a good leveling property is favorable as the fourth interlayer insulating film 315.

The fourth interlayer insulating film (such as acrylic film) 315, and the third interlayer insulating film (such as a silicon nitride film) 316 are sequentially etched back, thereby exposing a top portion of the pillar 314. FIG. 5D shows a cross sectional view of the state.

After that, a third conductive layer (a source wiring, a drain wiring) 317 is formed to be in contact with the pillar 314 by ink jetting.

Figure 6A:
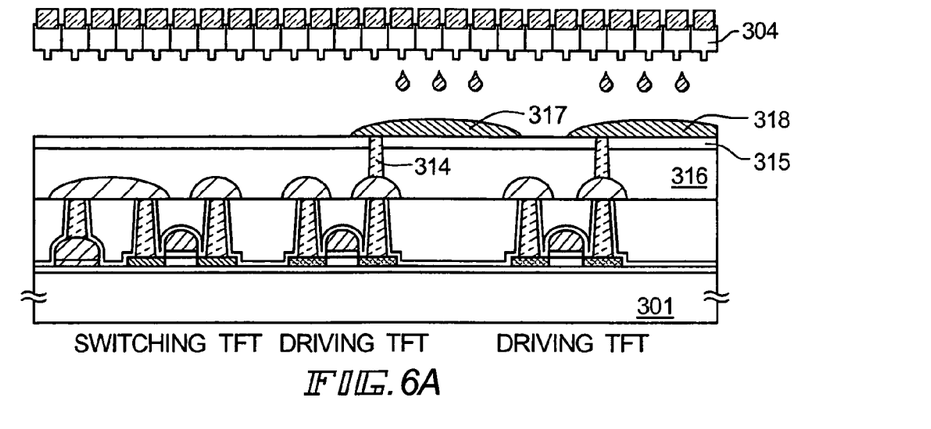
FIGS. 6A to 6C are cross sectional views showing a method for manufacturing an EL panel according to the present invention.

Then, a first pixel electrode 318 made of a transparent conductor is formed over the entire surface so that it is electrically connected to wirings for a driving TFT (FIG. 6A). The first pixel electrode 318 is preferably formed by using a material having a large work function. As examples thereof, a compound of indium oxide and tin oxide (ITO), a compound of indium oxide and zinc oxide, zinc oxide, tin oxide, indium oxide, titanium nitride and the like can be given. In this embodiment, an ITO film is formed to have a thickness of 0.1 μm by ink jetting as the first pixel electrode 318 (FIG. 6A).

Figure 6B:
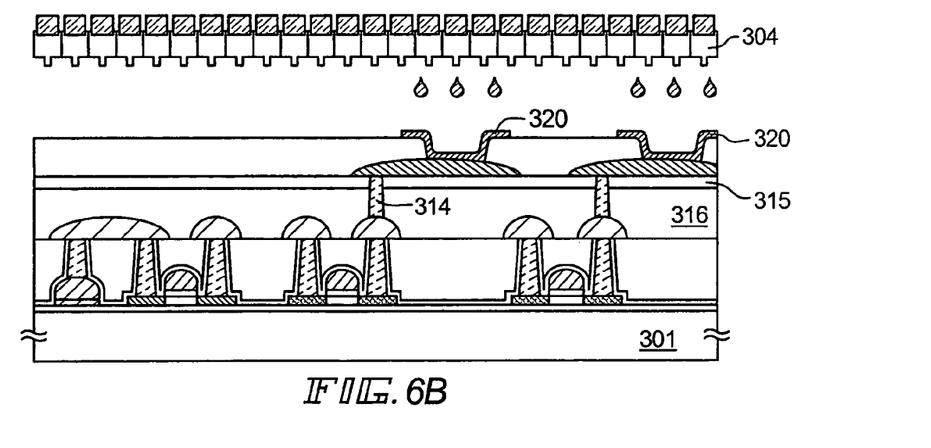
Figure 6C:
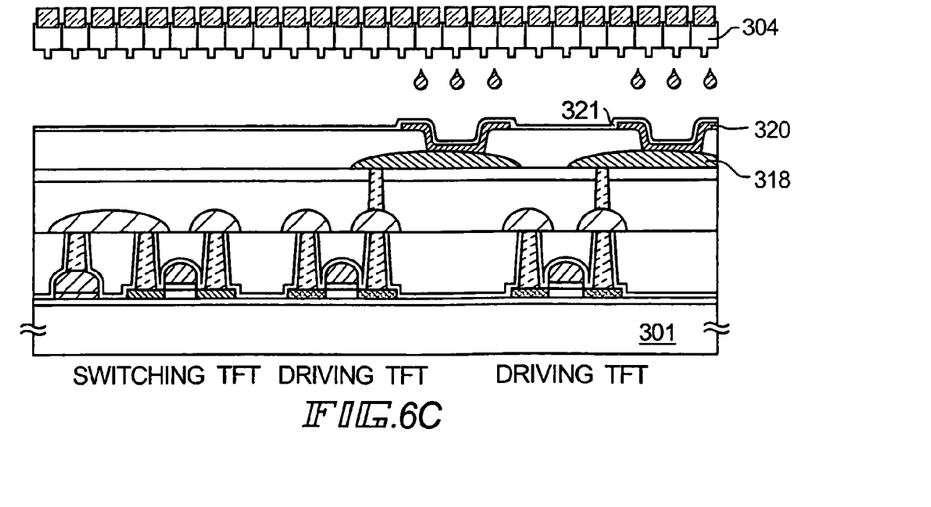

Thereafter, a formation step of light-emitting element of an organic EL is performed. An insulating film is formed to cover an end face of the first pixel electrode 318. The material for forming the insulating film is not limited in particular, and can be formed from an inorganic material or an organic material. Then, a region including an organic EL to be a light emitting layer is formed, at the time, a light emitting layer 320 is formed to be in contact with the first pixel electrode 318 sequentially under reduced pressure or in vacuum (FIG. 6B). The material for the light emitting layer 320 is not limited particularly. However, in the case of a full-color display, materials for red, green, blue are each used. In addition, a second pixel electrode (cathode) 321 is formed by vapor deposition under reduced pressure or in vacuum (FIG. 6C).

The second pixel electrode (cathode) 321 is formed of a laminate of a thin film including a metal having a small work function (such as lithium (Li), magnesium (Mg), cesium (Cs)), and a transparent conductive film laminated over a thin film including Li, Mg, etc. The film thickness may be set appropriately so that the second pixel electrode can serve as a cathode, preferably, about from 0.01 μm to 1.0 μm in thickness. In this embodiment, an alloy film (Al—Li) of aluminum and lithium is formed to be 0.1 μm in thickness. Note that, the second pixel electrode 321 is formed over the entire surface.

A metal film generally used for a cathode is a metal film that includes an element belonging to Group 1 or 2 in the periodic table. However, since such a metal film is easily oxidized, the surface thereof is preferably protected. And since the required film thickness is thin, it is preferable that resistance of the cathode is reduced and the cathode is protected by providing a conductive film having low resistance supplementarily. A metal film containing aluminum, copper, or silver mainly is used as the conductive film having low resistance.

The light emitting layer 320 and the second pixel electrode 321 can be formed by exchanging composition to be discharged from an ink head nozzle 304, or an ink head nozzle 304 that is filled with composition. At this time, since the steps can be performed without being exposed to the air, high reliability of the light emitting element that does not resist moisture can be obtained. A heat treatment is performed at temperatures from 150° C. to 300° C. so that the viscosity of the jetted composition is set to a desired value (50 cp or less).

A laminate of the first pixel electrode 318, the light emitting layer 320 and the second pixel electrode 321 that have been formed in the preceding steps corresponds to a light emitting element. The first pixel electrode 318 is an anode and the second electrode 321 is a cathode. There are a singlet excited state and a triplet excited state as an excited state of the light emitting element, and light emission can be obtained through either of the excited states.

In this embodiment, a case of performing a bottom emission in which light generated in the light emitting element passes through the substrate 301 side (the bottom side) is shown. However, a top emission for transmitting light upwardly from the substrate 301 may be performed. In this case, the first pixel electrode 318 is a cathode and the second pixel electrode 321 is an anode, and the second pixel electrode 321 may be formed from a transparent material. Further, a driving TFT is preferably an n-channel TFT. Note that, the conductivity type of the driving TFT may be changed appropriately, but a capacitor element is arranged so as to keep voltage between a gate and a source of the driving TFT. In this embodiment, the display device using a light emitting element is shown as an example. However, the present invention can be applied to a liquid crystal display device using a liquid crystal element or other display devices.

The present invention having the above structures can be applied to a larger substrate, and can provide a manufacturing method of wirings, a conductive layer and a display device that can enhance the throughput or usability of materials.

Although the present invention has been fully described by way of Embodiment Mode and Embodiments with reference to the accompanying drawings, it is to be understood that various changes and modifications will be apparent to those skilled in the art. Therefore, unless otherwise such changes and modifications depart from the scope of the present invention hereinafter defined, they should be constructed as being included therein.

What is claimed is:

1. A method for manufacturing a device comprising the steps of:
   forming a conductive pattern over a substrate;
   forming a conductor pillar on the conductive pattern;
   forming an insulating film over the conductor pillar and the conductive pattern;
   etching back the insulating film to expose the conductor pillar; and
   forming a wiring on the insulating film by ink jetting after etching back the insulating film,
   wherein the wiring contacts an upper surface of the conductor pillar,
   wherein an entire surface of the insulating film is etched during the step of etching back.

2. The method of manufacturing a device according to claim 1 wherein said substrate has an insulating surface.

3. The method of manufacturing a device according to claim 1 wherein said semiconductor device is an active matrix display device.

4. The method of manufacturing a device according to claim 1 wherein said conductor pillar comprises a same material as said conductive pattern.

5. A method for manufacturing a device comprising the steps of:
   forming a semiconductor layer over a substrate;
   forming a conductor pillar on the semiconductor layer;
   forming an insulating film over the conductor pillar and the semiconductor layer;
   etching back the insulating film to expose the conductor pillar; and
   forming a wiring on the insulating film by ink jetting after etching back the insulating film,
   wherein the wiring contacts an upper surface of the conductor pillar,
   wherein an entire surface of the insulating film is etched during the step of etching back.

6. The method of manufacturing a device according to claim 5 wherein said substrate has an insulating surface.

7. The method of manufacturing a device according to claim 5 wherein said semiconductor device is an active matrix display device.

8. A method for manufacturing a device comprising the steps of:
   forming a conductive pattern over a substrate;
   forming a conductive film on the conductive pattern;
   forming a resist pattern on the conductive film by ink jetting;
   etching the conductive film by using the resist pattern as a mask to form a conductor pillar on the conductive pattern;
   forming an insulating film over the conductor pillar and the conductive pattern;
   etching back the insulating film to expose the conductor pillar; and
   forming a wiring on the insulating film by ink jetting after etching back the insulating film,
   wherein the wiring contacts an upper surface of the conductor pillar,
   wherein an entire surface of the insulating film is etched during the step of etching back.

9. The method of manufacturing a device according to claim 8 wherein said substrate has an insulating surface.

10. The method of manufacturing a device according to claim 8 wherein said semiconductor device is an active matrix display device.

11. The method of manufacturing a device according to claim 8 wherein said conductor pillar comprises a same material as said conductive pattern.

12. A method for manufacturing a device comprising the steps of:
    forming a semiconductor layer over a substrate;
    forming a conductive film on the semiconductor layer;
    forming a resist pattern on the conductive film by ink jetting;
    etching the conductive film by using the resist pattern as a mask to form a conductor pillar on the semiconductor layer;
    forming an insulating film over the conductor pillar and the conductive pattern;
    etching back the insulating film to expose the conductor pillar; and
    forming a wiring on the insulating film by ink jetting after etching back the insulating film,
    wherein the wiring contacts an upper surface of the conductor pillar,
    wherein an entire surface of the insulating film is etched during the step of etching back.

13. The method of manufacturing a device according to claim 12 wherein said substrate has an insulating surface.

14. The method of manufacturing a device according to claim 12 wherein said semiconductor device is an active matrix display device.

* * * * *